United States Patent
Hong et al.

(10) Patent No.: US 8,339,196 B2
(45) Date of Patent: Dec. 25, 2012

(54) COMBINED CELL DOHERTY POWER AMPLIFICATION APPARATUS AND METHOD

(75) Inventors: Sung-Chul Hong, Hwaseong-si (KR); Jin-Wook Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/967,404

(22) Filed: Dec. 14, 2010

(65) Prior Publication Data
US 2011/0140775 A1 Jun. 16, 2011

(30) Foreign Application Priority Data
Dec. 16, 2009 (KR) ........................ 10-2009-0125397

(51) Int. Cl.
*H03F 3/68* (2006.01)
(52) U.S. Cl. ...................... 330/124 R; 330/295; 330/286
(58) Field of Classification Search .............. 330/124 R, 330/295, 84, 286, 53–54
See application file for complete search history.

(56) References Cited

U.S. PATENT DOCUMENTS

| | | | |
|---|---|---|---|
| 6,798,295 B2* | 9/2004 | Pengelly et al. | 330/295 |
| 7,301,395 B2* | 11/2007 | Mobbs | 330/124 R |
| 7,688,135 B2* | 3/2010 | Kim et al. | 330/124 R |
| 7,847,630 B2* | 12/2010 | Okubo et al. | 330/124 R |

* cited by examiner

*Primary Examiner* — Hieu Nguyen
(74) *Attorney, Agent, or Firm* — Jefferson IP Law, LLP (57) ABSTRACT

A Doherty power amplification apparatus and method using a combined cell are provided. The Doherty power amplification apparatus includes, a power splitter for splitting an input power, and outputting the split powers to a carrier amplification unit and (N−1) peaking amplification units, wherein the carrier amplification unit, including M carrier power amplifiers, for amplifying power output from the power splitter; the (N−1) peaking amplification units, each of which includes M peaking power amplifiers, for amplifying the respective split powers output from the power splitter, and a power combiner for combining a power amplified by the carrier amplification unit and the respective split powers amplified by the (N−1) peaking amplification units, and for outputting the combined power, wherein N represents an integer obtained by adding a number of the carrier amplification units and a number of the (N−1) peaking amplification units, and M represents an integer which is equal to or more than 1.

16 Claims, 6 Drawing Sheets

COMBINED CELL DOHERTY POWER AMPLIFICATION APPARATUS AND METHOD

PRIORITY

This application claims the benefit under 35 U.S.C. §119(a) to a Korean patent application filed in the Korean Intellectual Property Office on Dec. 16, 2009 and assigned Serial No. 10-2009-0125397, the entire disclosure of which is hereby incorporated by reference.

BACKGROUND OF THE INVENTION

1. Field of the Invention

The present invention relates to a Doherty power amplification apparatus and method using a combined cell.

2. Description of the Related Art

A Doherty power amplifier has recently been proposed for improving the efficiency of a power amplification apparatus. The Doherty power amplifier has a structure in which a carrier power amplifier and at least one peaking power amplifier are combined in parallel. A power amplification apparatus including a single carrier power amplifier and (N−1) peaking power amplifiers is referred to as an "N-way Doherty power amplification apparatus."

Figure 1:
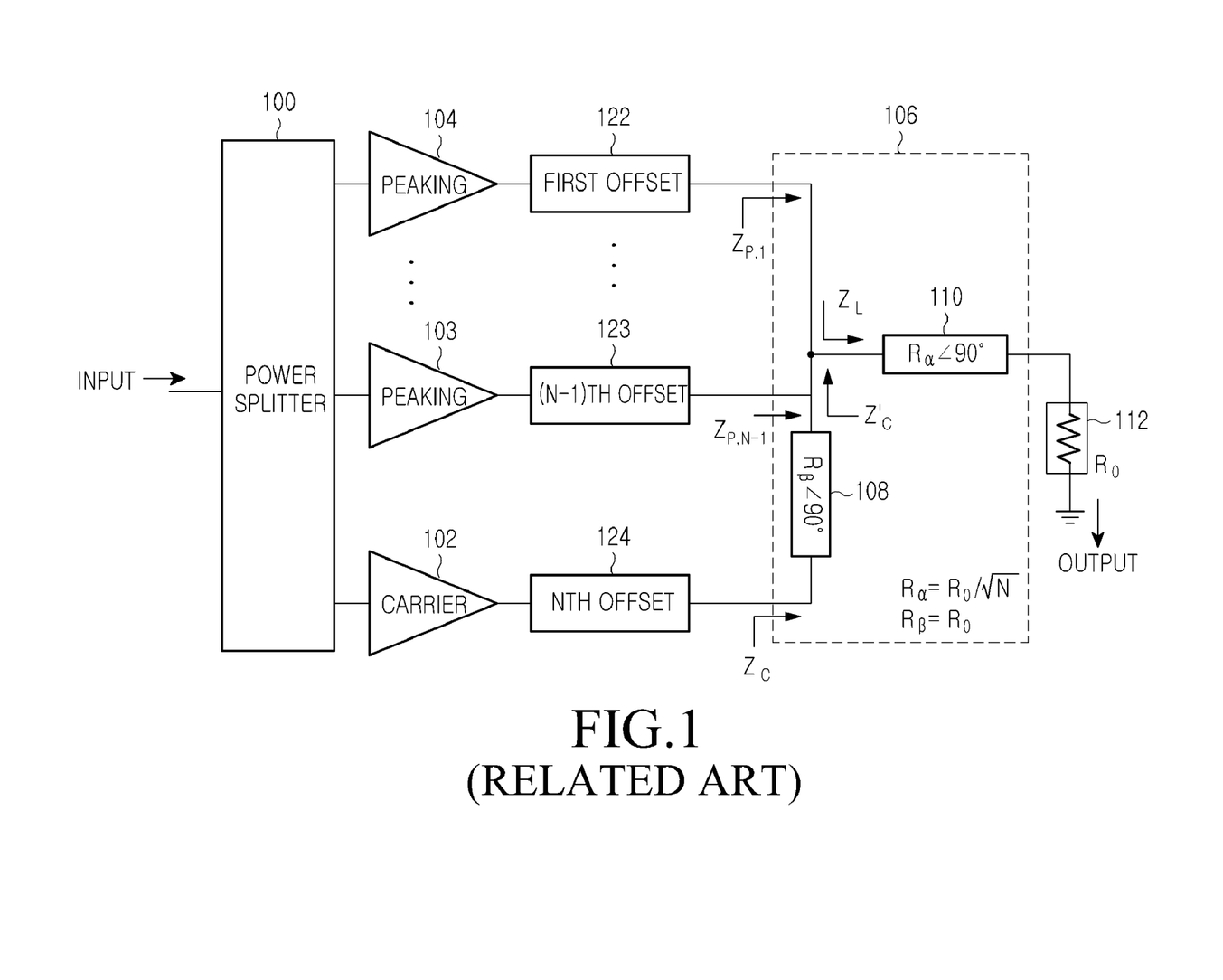
FIG. 1 is a block diagram illustrating a configuration of an N-way Doherty power amplification apparatus according to the related art.

FIG. 1 is a block diagram illustrating a configuration of an N-way Doherty power amplification apparatus according to the related art.

Referring to FIG. 1, an N-way Doherty power amplification apparatus includes a power splitter 100, a carrier power amplifier 102, (N−1) peaking power amplifiers 103 to 104, first to Nth offset transmission lines 122 to 124, a final output end 112, and a power combiner 106. Power combiner 106 includes first and second impedance transformers 108 and 110.

Power splitter 100 splits an input power into N powers, which have a phase difference between them of '90' degrees. It then outputs the N split powers to carrier power amplifier 102 and (N−1) peaking power amplifiers 103 to 104, respectively. Thereafter, carrier power amplifier 102 and (N−1) peaking power amplifiers 103 to 104 amplify the respective input powers, and output the amplified powers to the power combiner 106 through first to Nth offset transmission lines 122 to 124, respectively.

A high input DC bias having a value equal to or larger than a threshold value is used for an input terminal (i.e., gate or emitter) of carrier power amplifier 102. Therefore, carrier power amplifier 102 operates regardless of the magnitude of the input power. On the contrary, a low input DC bias having a value smaller than the threshold value is used for an input terminal of each of (N−1) peaking power amplifiers 103 to 104. Therefore, only when the input power is a high power having a power magnitude equal to or larger than a reference power, each of (N−1) peaking power amplifiers 103 to 104 amplifies the input power.

Namely, when the input power is a low power having a magnitude smaller than the reference power, only carrier power amplifier 102 operates. When the input power is a high power, carrier power amplifier 102 and (N−1) peaking power amplifiers 103 to 104 operate simultaneously. Accordingly, when the input power has a high Peak-to-Average Ratio (PAR), the input power can be amplified with high drain efficiency. The N-way Doherty power amplification apparatus operates in order to have a maximum efficiency in an output that is smaller than maximum output by −20×log(N) decibels (dB).

The Nth offset transmission line 124 controls an output direction of power provided by carrier power amplifier 102, so that the power provided by carrier power amplifier 102 may not flow into (N−1) peaking power amplifiers 103 to 104, but may be provided to power combiner 106. In addition, each of the first to (N−1) offset transmission lines 122 to 123 controls an output direction of power provided by a relevant peaking power amplifier so that power provided by the relevant peaking power amplifier of (N−1) peaking power amplifiers 103 to 104 may not flow into carrier power amplifier 102 and other peaking power amplifiers, but may be provided to power combiner 106.

Power combiner 106 combines power provided by carrier power amplifier 102 with power provided by each of the (N−1) peaking power amplifiers 103 to 104, and provides the combined power to the final output end 112.

First, second impedance transformer 110 has a characteristic impedance value $R_O/\sqrt{N}$ (where N represents an integer obtained by adding the number of carrier power amplifiers and that of peaking power amplifiers). In addition, when a load impedance (hereinafter, referred to as "combined load impedance") is defined at a point where there is provided combined power which is generated by combining first power provided at the output end of first impedance transformer 108 and second power provided by each of (N−1) peaking power amplifiers 103 to 104, second impedance transformer 110 adjusts a value $Z_L$ of the combined load impedance, so that combined load impedance value $Z_L$ may become 1/N times (i.e., $R_O/N$) as much as a load impedance (hereinafter, referred to as "output load impedance") value of final output end 112. First impedance transformer 108 has a characteristic impedance value $R_O$, and changes a load impedance value $Z_C$ at an output end of carrier power amplifier 102.

Figure 2A:
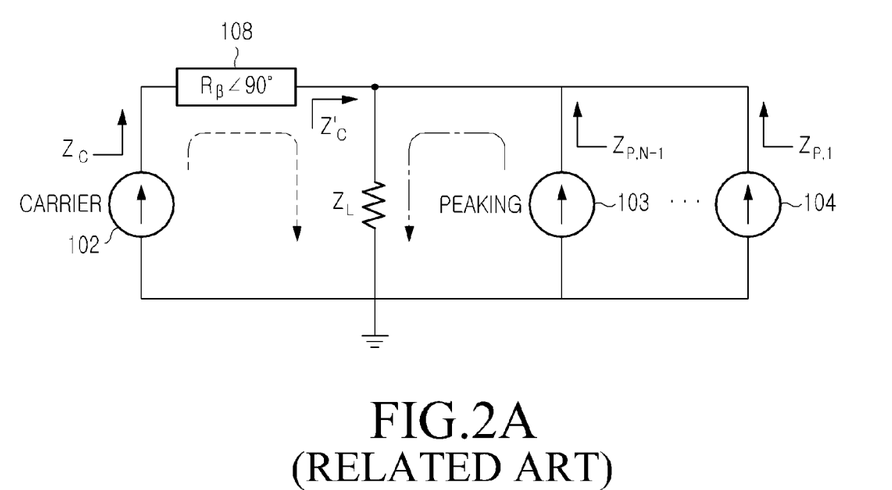
FIGS. 2A and 2B illustrate an operation of an N-way Doherty power amplification apparatus according to the related art.
Figure 2B:
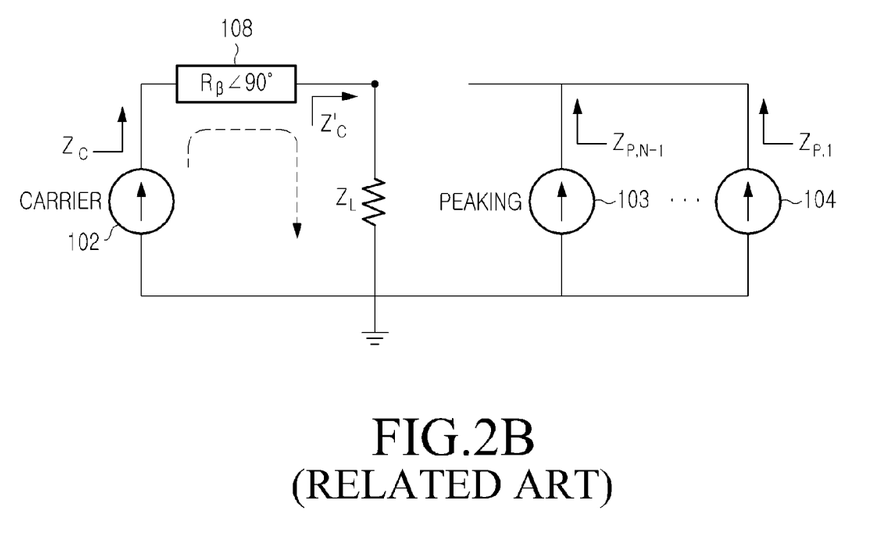

FIGS. 2A and 2B illustrate an operation of an N-way Doherty power amplification apparatus according to the related art.

Referring to FIGS. 2A and 2B, when carrier power amplifier 102 and (N−1) peaking power amplifiers 103 to 104 all operate with the high power input, first impedance transformer 108 sets a value $Z_C$ of a load impedance, which is defined at the output end of carrier power amplifier 102, to a value $R_O$ corresponding to the output load impedance value.

In addition, when only carrier power amplifier 102 operates with the low power input, first impedance transformer 108 sets value $Z_C$ of the load impedance, which is defined at the output end of carrier power amplifier 102, to a value $N \cdot R_O$ which is N times as much as the output load impedance value.

When power combiner 106 changes a load impedance at the output end of carrier power amplifier 102 according to whether peaking power amplifier 104 operates, it is referred to as "load modulation". According to the load modulation, the gain of finally-output power in a case of low power input becomes N times as large as in a case of high power input. Therefore, N-way Doherty power amplification apparatus can have linear input/output.

Therefore, a need exists for a Doherty power amplification apparatus and method in which at least one carrier power amplifier and at least one peaking power amplifier are combined on a cell-by-cell basis respectively, and which can output higher power without power loss.

SUMMARY OF THE INVENTION

An aspect of the present invention is to address the above-mentioned problems and/or disadvantages and to provide at least the advantages described below. Accordingly, an aspect of the present invention is to provide a Doherty power amplification apparatus and method using a combined cell.

Another aspect of the present invention provides a Doherty power amplification apparatus and method, in which at least one carrier power amplifier and at least one peaking power amplifier are combined on a cell-by-cell basis respectively, and can output high power without power loss.

Still another aspect of the present invention provides a Doherty power amplification apparatus and method capable of efficiently amplifying and outputting power.

In accordance with an aspect of the present invention, a combined cell Doherty power amplification apparatus is provided. The apparatus includes a power splitter for splitting an input power, and for outputting split powers to a carrier amplification unit and (N−1) peaking amplification units, the carrier amplification unit, including M carrier power amplifiers, for amplifying a power output from the power splitter, the (N−1) peaking amplification units, each of which includes M peaking power amplifiers, for amplifying the respective split powers output from the power splitter, and a power combiner for combining a power amplified by the carrier amplification unit and the respective split powers amplified by the (N−1) peaking amplification units, and for outputting combined power, wherein N represents an integer obtained by adding a number of the carrier amplification units and a number of the (N−1) peaking amplification units, and M represents an integer equal to or more than 1.

In accordance with another aspect of the present invention, a method for amplifying power in a combined cell Doherty power amplification apparatus is provided. The method includes splitting an input power, and outputting split powers to a carrier amplification unit and (N−1) peaking amplification units, amplifying a power output from the power splitter by the carrier amplification unit including M carrier power amplifiers, amplifying the respective split powers output from the power splitter by the (N−1) peaking amplification units, each of which includes M peaking power amplifiers, and combining a power amplified by the carrier amplification unit and the respective split powers amplified by the (N−1) peaking amplification units, and outputting combined power, wherein N represents an integer obtained by adding a number of the carrier amplification units and a number of the (N−1) peaking amplification units, and M represents an integer equal to or more than 1.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in the comprehensive understanding of exemplary embodiments of the present invention as defined by their claims and their equivalents. It includes various specific detail to assist in that understanding but these are to be regarded as merely exemplary. Accordingly, those of ordinary skill in the art will recognize that various changes and modifications of the embodiments described herein can be made without departing from the scope and spirit of the invention. In addition descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide a power amplification apparatus and method capable of outputting high power by combining multiple power amplifiers. The exemplary embodiments of the present invention will be described, assuming that a Doherty power amplification apparatus is an example of the power amplification apparatus. However, it goes without saying that the power amplification apparatus and method can be applied to and be used for not only the Doherty power amplification apparatus but also other power amplification apparatuses.

FIGS. 3 through 6, discussed below, and the various exemplary embodiments used to describe the principles of the present disclosure in this patent document are by way of illustration only and should not be construed in any way that would limit the scope of the disclosure. Those skilled in the art will understand that the principles of the present disclosure may be implemented in any suitably arranged communications system. The terms used to describe various embodiments are exemplary. It should be understood that these are provided to merely aid the understanding of the description, and that their use and definitions in no way limit the scope of the invention. Terms first, second, and the like are used to differentiate between objects having the same terminology and are in no way intended to represent a chronological order, unless where explicitly state otherwise. A set is defined as a non-empty set including at least one element.

Figure 3:
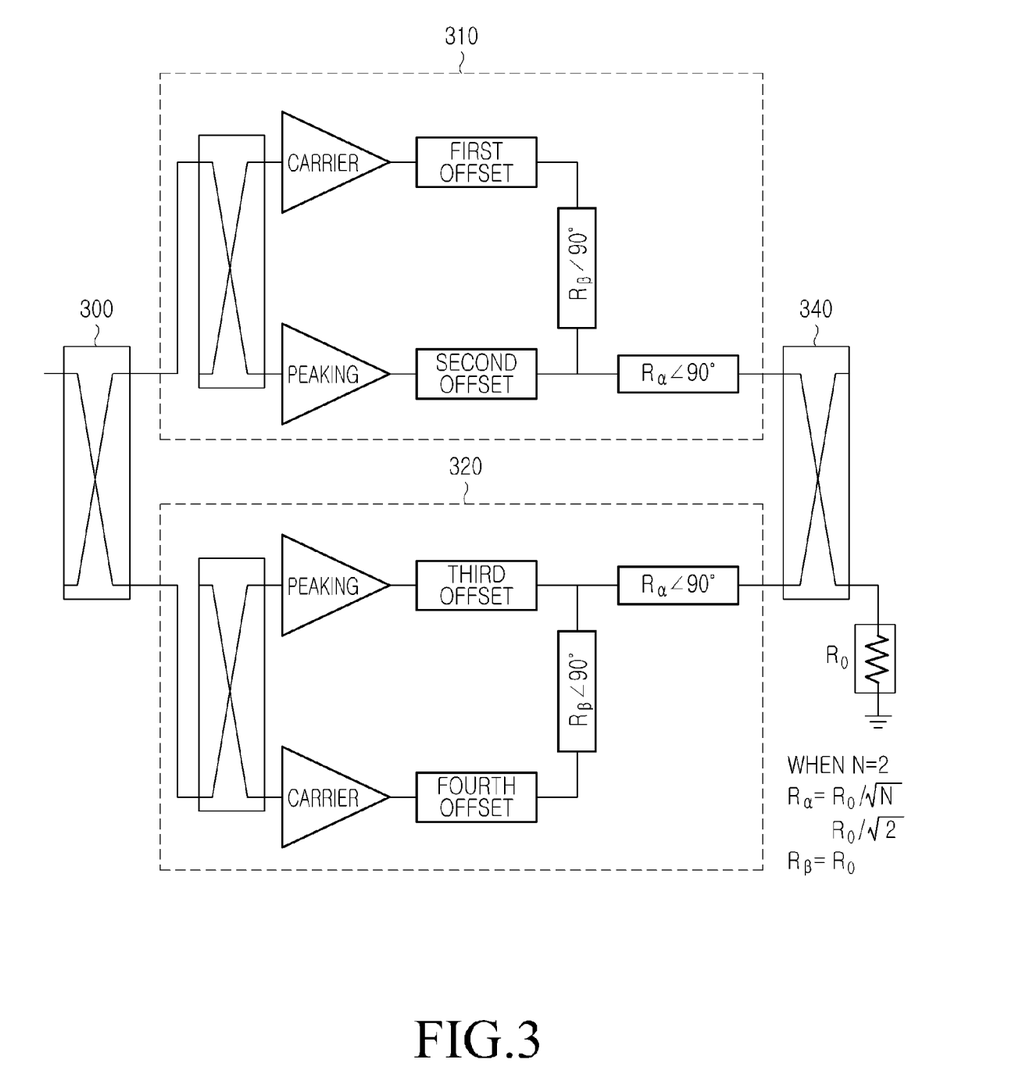
FIG. 3 is a block diagram illustrating two Doherty power amplification apparatuses combined in parallel according to an exemplary embodiment of the present invention.

FIG. 3 is a block diagram illustrating two Doherty power amplification apparatuses combined in parallel according to an exemplary embodiment of the present invention.

Referring to FIG. 3, a power amplification apparatus includes a power splitter 300 and a power combiner 340, each of which includes a hybrid coupler, and first and second Doherty power amplification apparatuses 310 and 320, which are combined in parallel.

Power splitter 300 splits an input power into two powers, which have a phase difference between them of '90' degrees and the same magnitude. It then outputs the two split powers to first and second Doherty power amplification apparatuses 310 and 320, respectively.

Each of the first and second Doherty power amplification apparatuses 310 and 320 amplifies the input power, and outputs the amplified power to the power combiner 340. Each of the first and second Doherty power amplification apparatuses 310 and 320 has the same configuration as the Doherty power amplification apparatus described in FIG. 1. Therefore, a description of configuration units of each of first and second Doherty power amplification apparatuses 310 and 320 will be omitted.

When the respective powers are output from first and second Doherty power amplification apparatuses 310 and 320 respectively, power combiner 340 combines the two powers provided by the first and second Doherty power amplification apparatuses 310 and 320, and outputs the combined power.

The power amplification apparatus configured as above includes two combined Doherty power amplification apparatuses. Therefore, it has a maximum output power that is larger than in a case where a single Doherty power amplification apparatus is used. However, the power amplification apparatus includes power splitter 300 and power combiner 340, each of which includes a hybrid coupler. As a result, the gain of the power amplification apparatus is lower than in the case where each of first and second Doherty power amplification apparatuses 310 and 320 is used. This is because the hybrid coupler includes passive elements and loses power in itself.

Since the power amplification apparatus includes power splitter 300 and power coupler 340 in which two hybrid couplers are used, the gain of the power amplification apparatus is reduced by twice as much as power loss value produced by a single hybrid coupler. Besides, a maximum output capacity and an average output value of the power amplification apparatus are also reduced by power loss value produced by the hybrid coupler of power combiner 340. As a result, the efficiency of the power amplification apparatus is reduced. Moreover, when power combiner 340 includes a hybrid coupler, it should have a capacity, which is significantly large as compared with a usual power combiner, for combining amplified powers. In addition, an element having a large power capacity should be used for an isolator in an isolation port of four ports of the hybrid coupler. In addition, the hybrid coupler, which is included in each of the power splitter 300 and the power combiner 340, splits or combines only two signals. Therefore, maximum output capacity can also increase only two-square times at all times.

In order to address the problems described above, an exemplary embodiment of the present invention provides a Doherty power amplification apparatus and method, in which at least one carrier power amplifier and at least one peaking power amplifier are combined in a cell-by-cell basis respectively, and which can reduce power loss and provide high power.

Figure 4:
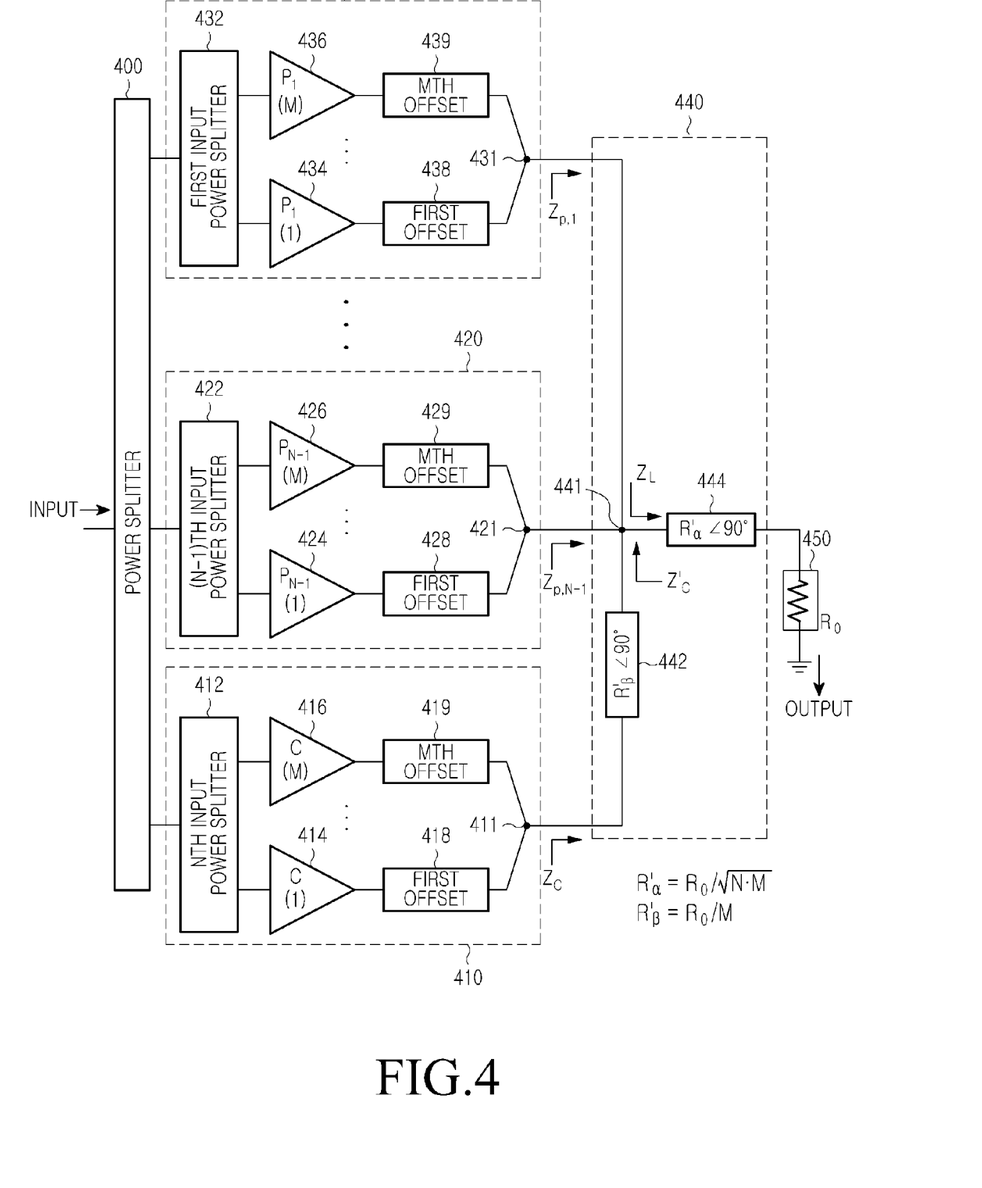
FIG. 4 is a block diagram illustrating a configuration of a Doherty power amplification apparatus according to an exemplary embodiment of the present invention.

FIG. 4 is a block diagram illustrating a configuration of a Doherty power amplification apparatus according to an exemplary embodiment of the present invention.

Referring to FIG. 4, a Doherty power amplification apparatus includes a power splitter 400, a carrier amplification unit 410 including M carrier power amplifiers, (N−1) peaking amplification units 420 to 430 including M peaking power amplifiers, and a power combiner 440.

Power splitter 400 splits an input power into N signals, and outputs the respective N powers to carrier amplification unit 410 and (N−1) peaking amplification units 420 to 430, respectively.

Carrier amplification unit 410 can be called a "single carrier combined cell," which combines powers provided by the M carrier power amplifiers and outputs the combined power. Each of (N−1) peaking amplification units 420 to 430 can be called "peaking combined cell," which combines powers provided by the M peaking power amplification amplifiers and outputs the combined power.

Carrier amplification unit 410 includes an Nth input power splitter 412, first to Mth carrier power amplifiers 414 to 416, and first to Mth offset transmission lines 418 to 419.

The Nth input power splitter 412 splits power, which is provided by power splitter 400, into M powers whose phases are in phase, and outputs the M powers to first to Mth carrier power amplifiers 414 to 416, respectively. Then, first to Mth carrier power amplifiers 414 to 416 amplify the respective input powers and output the amplified powers to first to Mth offset transmission lines 418 to 419, respectively.

First to Mth offset transmission lines 418 to 419 control output directions of powers provided by first to Mth carrier power amplifiers 414 to 416, so that the powers provided by first to Mth carrier power amplifiers 414 to 416 may flow into relevant carrier power amplifiers, respectively.

Namely, when load impedances are defined between a combined point 411, where output powers are combined, and output lines of first to Mth offset transmission lines 418 to 419, and other load impedances are defined between first to Mth carrier power amplifiers 414 to 416 and input lines of first to Mth offset transmission lines 418 to 419 respectively, first to Mth offset transmission lines 418 to 419 set the former load impedances to have larger values than the latter load impedances, respectively. Accordingly, powers provided by first to Mth carrier power amplifiers 414 to 416 can be output through the output end of carrier amplification unit 410.

Powers, which are output from first to Mth offset transmission lines 418 to 419, are combined at combined point 411, and are then provided to power combiner 440.

The (N−1)th peaking amplification unit 420 of (N−1) peaking amplification units 420 to 430 includes an (N−1)th input power splitter 422, first to Mth peaking power amplifiers 424 to 426, and first to Mth offset transmission lines 428 to 429. In addition, similarly to the (N−1)th peaking amplification unit 420, remaining peaking amplification unit 430 includes a first input power splitter 432, first to Mth peaking power amplifiers 434 to 436, and first to Mth offset transmission lines 438 to 439.

When (N−1) peaking amplification units 420 to 430 operate with a high power input, first offset transmission lines 428 to 438 to Mth offset transmission lines 429 to 439, which are included in (N−1) peaking amplification units 420 to 430, operate similarly to operations of first to Mth offset transmission lines 418 to 419 included in carrier amplification unit 410.

Namely, when load impedances are defined between combined points 421 to 431 and output lines of first offset transmission lines 428 to 438 to Mth offset transmission lines 429 to 439, and other load impedances are defined between first peaking power amplifiers 424 to 434 to Mth peaking power amplifiers 426 to 436 and input lines of first offset transmission lines 428 to 438 to Mth offset transmission lines 429 to 439 respectively, first offset transmission lines 428 to 438 to Mth offset transmission lines 429 to 439 set the former load impedances to have larger values than the latter load impedances, respectively. Accordingly, first offset transmission lines 428 to 438 to Mth offset transmission lines 429 to 439 control powers, which are output from first peaking power amplifiers 424 to 434 to Mth peaking power amplifiers 426 to 436, to be output through output ends of peaking amplification units 420 to 430, respectively.

Powers, which are output from first offset transmission lines 428 to 438 to Mth offset transmission lines 429 to 439, are provided to power combiner 440.

Even when only carrier power amplification unit 410 operates with a low power input, first offset transmission lines 428 to 438 to Mth offset transmission lines 429 to 439, which are included in (N−1) peaking amplification units 420 to 430, increase load impedance values of output lines of (N−1) peaking amplification units 420 to 430 at a combined point 441 of power combiner 440. By doing this, they control an output direction so that power, which is output from carrier power amplification unit 410 and then input to power combiner 440, may not flow into peaking amplification units 420 to 430.

Meanwhile, each of first to Mth carrier power amplifiers 414 to 416 outputs power having a magnitude corresponding to the same load impedance value, i.e., a load impedance value $Z_C$ (hereinafter, referred to as "carrier output end load impedance value") at the output end of a carrier power amplifier in the Doherty power amplification apparatus of FIG. 1.

Accordingly, each of load impedance values at combined point 411 where powers, which are output from first to Mth carrier power amplifiers 414 to 416, are combined becomes a value $M \cdot Z_C$ which is M times as much as the carrier output end load impedance value.

Furthermore, each of first to Mth peaking power amplifiers 424 to 426, which are included in (N−1)th peaking amplification unit 420 of peaking amplification units 420 to 430, outputs power having a magnitude corresponding to a load impedance value $Z_{P,N-1}$ (hereinafter, referred to as "peaking output end load impedance value") of the output end of a peaking power amplifier in the Doherty power amplification apparatus of FIG. 1.

Accordingly, each of load impedance values at output ends of first to Mth peaking power amplifiers 424 to 426 becomes a value $M \cdot Z_{P,N-1}$ which is M times as much as the peaking output end load impedance value.

In addition, similarly to (N−1)th peaking amplification unit 420, each of load impedance values at output ends of first to Mth peaking power amplifiers 434 to 436, which are included in remaining peaking amplification unit 430, becomes a value $M \cdot Z_{P,N-1}$ which is M times as much as the peaking output end load impedance value.

Meanwhile, configuration units in carrier amplification unit 410 operate regardless of the magnitude of the input power, whereas configuration units in peaking amplification units 420 to 430 operate when the magnitude of the input power is equal to or more than a magnitude of a reference power (i.e., high power).

Power combiner 440 combines the respective split powers provided by carrier amplification unit 410 and peaking amplification units 420 to 430, and outputs the combined power.

Power combiner 440 includes a first impedance transformer 442 and a second impedance transformer 444.

First, second impedance transformer 444 has a characteristic impedance value $R_O/\sqrt{(N \cdot M)}$ (where N represents an integer obtained by adding the number of carrier amplification units and that of peaking amplification units). In addition, when a load impedance (hereinafter, referred to as "combined load impedance") is defined at combined point 441 where first power provided at the output end of first impedance transformer 442 is combined with second power provided by each of peaking amplification units 420 to 430, second impedance transformer 444 adjusts a value $Z_L$ of the combined load impedance so that combined load impedance value $Z_L$ may become a value $R_O/(N \cdot M)$ which is $1/(N \cdot M)$ times as much as a load impedance (hereinafter, referred to as "output load impedance") value of final output end 450.

First impedance transformer 442 has a characteristic impedance value $R_O/M$, and changes a load impedance value at the output end of carrier amplification unit 410.

Specifically, when powers are output from carrier amplification unit 410 and peaking amplification units 420 to 430 with a high power input, first impedance transformer 442 sets a load impedance value $Z_C$, which is defined at the output end of carrier amplification unit 410, to a value $R_O/M$ which is $1/M$ times as much as output load impedance value $R_O$.

In addition, when power is output only from carrier amplification unit 410, first impedance transformer 442 sets a load impedance value, which is defined at the output end of carrier amplification unit 410, to a value $R_O \cdot N/M$ which is N/M times as much as the output load impedance value.

Each of load impedance values at output ends of first to Mth carrier power amplifiers 414 to 416 in carrier amplification unit 410 becomes a value which is M times as much as a load impedance value of combined point 411. Therefore, the operation of first impedance transformer 442 as described above is performed so that each of the load impedance values at output ends of first to Mth carrier power amplifiers 414 to 416 in carrier amplification unit 410 may have the same load impedance value as a load impedance value at the output end of the usual carrier power amplification apparatus.

According to the operation of power combiner 440 as described above, maximum output power, which is as large as when (N·M) power amplifiers are combined, can be output from final output end 450 without power loss.

Figure 5:
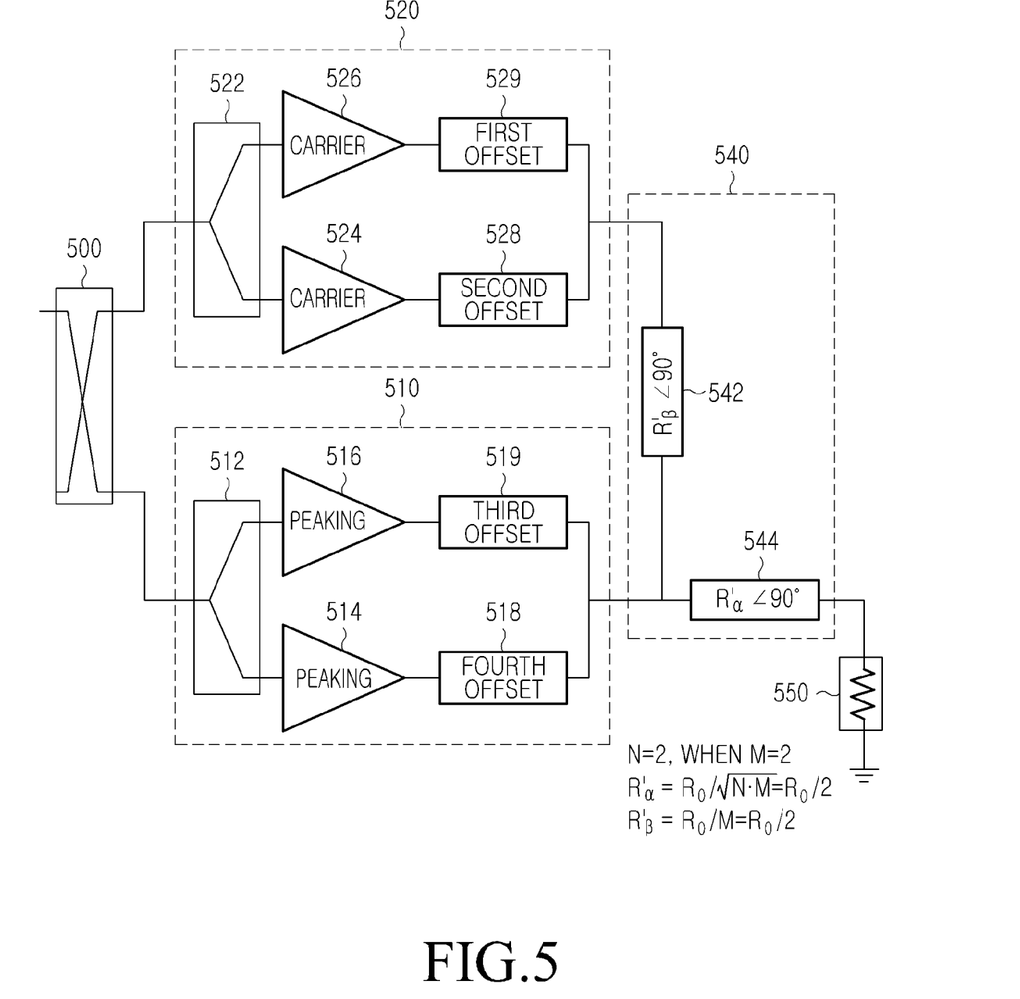
FIG. 5 is a block diagram illustrating a power amplification apparatus according to an exemplary embodiment of the present invention.

FIG. 5 is a block diagram illustrating a power amplification apparatus according to an exemplary embodiment of the present invention.

Referring to FIG. 5, a power amplification apparatus includes a single peaking amplification unit and a single carrier amplification unit. The peaking amplification unit includes two peaking power amplifiers. The carrier amplification unit includes two carrier power amplifiers.

The power amplification apparatus includes a power splitter 500, a peaking amplification unit 510, a carrier amplification unit 520, and a power combiner 540. Peaking amplification unit 510 includes a first input power splitter 512, a first peaking power amplifier 516, a second peaking power amplifier 514, a third offset transmission line 519, and a fourth offset transmission line 518. Carrier amplification unit 520 includes a second input power splitter 522, a first carrier power amplifier 526, a second carrier power amplifier 524, a first offset transmission line 529, and a second offset transmission line 528. Power combiner 540 includes a first impedance transformer 542 and a second impedance transformer 544.

Configuration units of the power amplification apparatus are the same as configuration units of a power amplification apparatus when N and M are all '2' in FIG. 4. Therefore, a description of the configuration units will be omitted.

When carrier amplification unit 520 and peaking amplification unit 510 all provide powers in the power amplification apparatus as described above, a load impedance value $Z_C$, which is defined at the output end of carrier amplification unit 520, and a load impedance value $Z_P$, which is defined at the output end of peaking amplification unit 510, are all set to a value $1/2 \cdot R_O$, which is 1/2 times as much as an impedance value $R_O$ of final output load 550.

The first and second powers are combined and then output according to the load impedance values which have been set, as described above.

On the other hand, when low power is input to the power amplification apparatus and only carrier amplification unit 520 provides power, load impedance value $Z_C$ at the output end of carrier amplification unit 520 is set to a value $2/2 \cdot R_O$, which is the same as load impedance value of final output end 500.

Accordingly, the Doherty power amplification apparatus can output power, which is twice as high compared with when a single Doherty power amplification apparatus is used, without loss.

Hereinafter, an operation process of the Doherty power amplification apparatus according to an exemplary embodiment of the present invention will be described with reference to FIG. 6.

Figure 6:
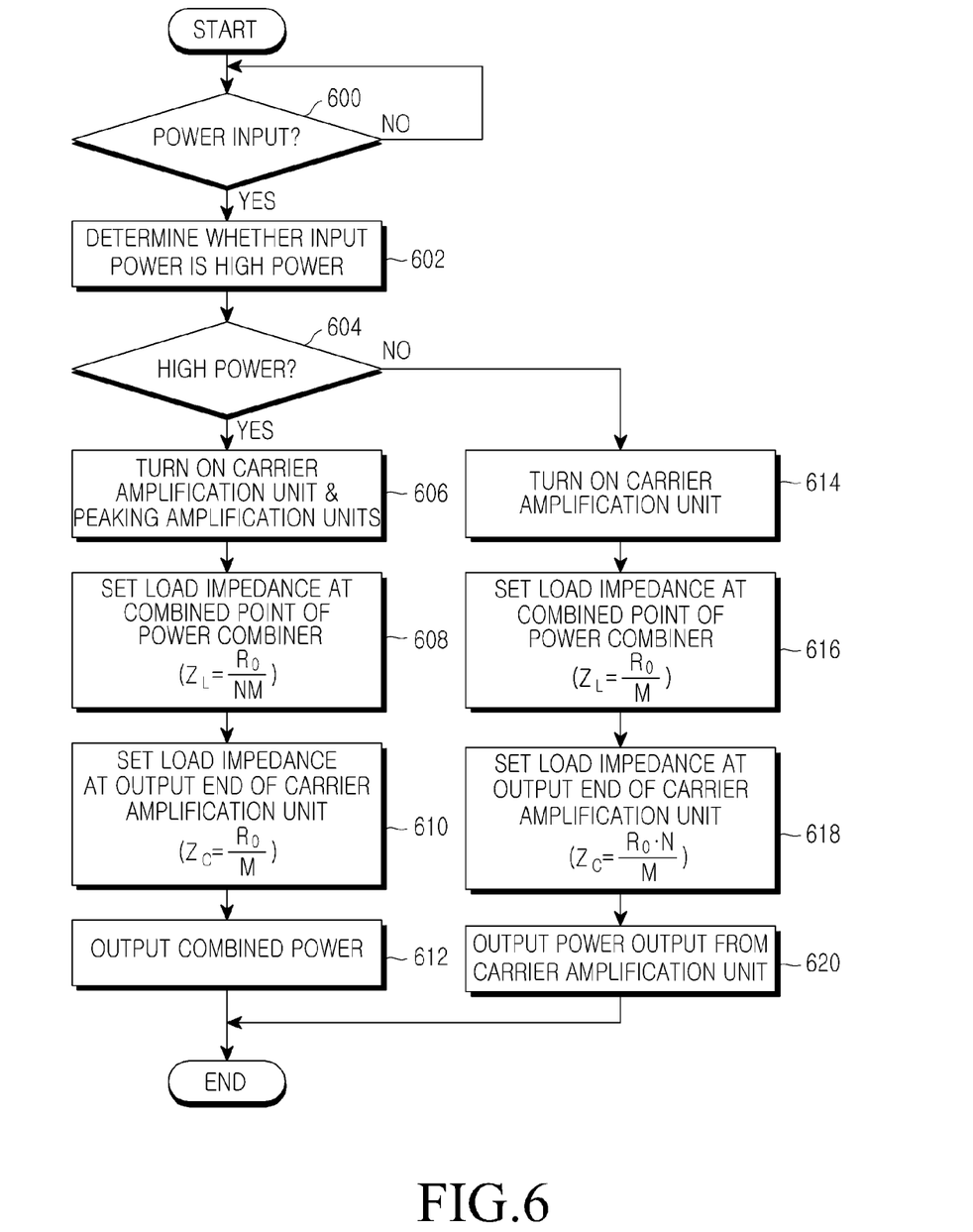
FIG. 6 is a flowchart illustrating an operation of a Doherty power amplification apparatus according to an exemplary embodiment of the present invention.

FIG. 6 is a flowchart illustrating an operation of a Doherty power amplification apparatus according to an exemplary embodiment of the present invention. For better understanding of the operation of FIG. 6, reference will be made to the configuration units of FIG. 4.

Referring to FIG. 6, a Doherty power amplification apparatus determines whether power is input in step 600. If it is determined in step 600 that power is input, the Doherty power amplification apparatus determines whether the input power is a high power equal to or more than a reference power in step 602.

If it is determined in step 604 that the input power is a high power, the Doherty power amplification apparatus proceeds to step 606. In step 606, it turns on carrier amplification unit 410 and peaking amplification units 420 to 430. Thereafter, the Doherty power amplification apparatus splits the input power according to the number of carrier amplification unit 410 and peaking amplification units 420 to 430. It then outputs the split powers to carrier amplification unit 410 and peaking amplification units 420 to 430.

In step 608, the Doherty power amplification apparatus sets a load impedance at combined point 441 of power combiner 440 where powers, which carrier amplification unit 410 and peaking amplification units 420 to 430 provide respectively, are combined. Namely, it sets a load impedance value $Z_L$ at combined point 441 to a value $R_O/(N \cdot M)$ which is $1/(N \cdot M)$ times as much as output load impedance value $R_O$.

In step 610, the Doherty power amplification apparatus adjusts a load impedance at the output end of carrier amplification unit 410. Specifically, it sets a load impedance value $Z_C$, which is defined at the output end of carrier amplification unit 410, to a value $R_O/M$ which is 1/M times as much as output load impedance value $R_O$.

In step 612 when each of carrier amplification unit 410 and peaking amplification units 420 to 430 outputs power, the Doherty power amplification apparatus enables power combiner 440 to combine the output powers and output the combined power.

In contrast, if it is determined in step 604 that the input power is a low power, the Doherty power amplification apparatus proceeds to step 614. In step 614, it turns on carrier amplification unit 410, and turns off peaking amplification units 420 to 430. Then, it outputs the input power to carrier amplification unit 410.

In step 616, the Doherty power amplification apparatus sets a load impedance at combined point 441 of power combiner 440. Namely, it sets a load impedance value $Z_L$ at combined point 441 to a value $R_O/M$ which is 1/M times as much as output load impedance value $R_O$.

In step 618, the Doherty power amplification apparatus sets a load impedance at the output end of carrier amplification unit 410. Specifically, it sets a load impedance value $Z_C$, which is defined at the output end of carrier amplification unit 410, to a value $R_O \cdot N/M$ which is N/M times as much as output load impedance value $R_O$.

In step 620, when power is output from carrier amplification unit 410, the Doherty power amplification apparatus combines the output power, and outputs the combined power.

According to the processes as described above, the Doherty power amplification apparatus can output high power without power loss.

According to exemplary embodiments of the present invention, use is made of a Doherty power amplification apparatus, in which at least one carrier power amplifier and at least one peaking power amplification are combined in a cell-by-cell basis, respectively. By doing this, high power can be output without power loss. In addition, there is an advantage in that the Doherty power amplification apparatus can amplify an input power and output the amplified power in an efficient manner. There is another advantage in that consumed power can be reduced and average output efficiency can be improved by reducing power loss at the output end of the Doherty power amplification apparatus. Due to the improvement of the average output efficiency, heat generation is reduced from the Doherty power amplification apparatus. Therefore, a heat dissipation structure can be miniaturized. Consequently, a miniaturized heat dissipation structure can make it easy to implement a system using the Doherty power amplification apparatus.

While the invention has been shown and described with reference to certain exemplary embodiments thereof, it will be understood by those skilled in the art that various changes in form and details may be made therein without departing from the spirit and scope of the invention as defined in the appended claims and their equivalents.

What is claimed is:

1. A combined cell Doherty power amplification apparatus comprising:
    a power splitter for splitting an input power, and outputting split powers to a carrier amplification unit and (N−1) peaking amplification units;
    the carrier amplification unit, including M carrier power amplifiers, for amplifying a power output from the power splitter;
    the (N−1) peaking amplification units, each of which includes M peaking power amplifiers, for amplifying the respective split powers output from the power splitter; and
    a power combiner for combining a power amplified by the carrier amplification unit and the respective split powers amplified by the (N−1) peaking amplification units, and for outputting combined power, wherein N represents an integer obtained by adding a number of the carrier amplification units and a number of the (N−1) peaking amplification units, and M represents an integer greater than 1.

2. The combined cell Doherty power amplification apparatus of claim 1, wherein the carrier amplification unit comprises:

a first input power splitter for splitting the power output from the power splitter into M powers; and M offset transmission lines for controlling an output direction of a power output from each of the M carrier power amplifiers, so that powers output from the respective M carrier power amplifiers are output to an output end of the carrier amplification unit and are combined at the output end.

3. The combined cell Doherty power amplification apparatus of claim 1, wherein each of the (N−1) peaking amplification units comprises:

a second input power splitter for splitting a power output from the power splitter into M powers; and M offset transmission lines for controlling an output direction of a power output from each of the M peaking power amplifiers, so that powers output from the respective M peaking power amplifiers are output to an output end of the peaking amplification unit and are combined at the output end.

4. The combined cell Doherty power amplification apparatus of claim 1, wherein the power combiner comprises:

a first impedance transformer for adjusting a load impedance value at an output end of the carrier amplification unit; and a second impedance transformer for adjusting a load impedance value at a combined point where the power output from the carrier amplification unit and the respective split powers amplified by the (N−1) peaking amplification units are combined.

5. The combined cell Doherty power amplification apparatus of claim 4, wherein a characteristic impedance of the first impedance transformer is set to a value that is 1/M times a final output load impedance value.

6. The combined cell Doherty power amplification apparatus of claim 4, wherein a characteristic impedance of the second impedance transformer is set to a value that is $1/\sqrt{(N \cdot M)}$ times a final output load impedance value.

7. The combined cell Doherty power amplification apparatus of claim 1, wherein the M carrier power amplifiers and the (N−1) peaking power amplifiers are combined in a cell-by-cell basis respectively.

8. The combined cell Doherty power amplification apparatus of claim 1, wherein configuration units in the carrier amplification unit operate regardless of a magnitude of the input power, and configuration units in the (N−1) peaking amplification units operate when the magnitude of the input power is equal to or more than a magnitude of a reference power.

9. A method for amplifying power in a combined cell Doherty power amplification apparatus, the method comprising:

splitting an input power, and outputting split powers to a carrier amplification unit and (N−1) peaking amplification units;

amplifying a power output from the power splitter by the carrier amplification unit including M carrier power amplifiers;

amplifying the respective split powers output from the power splitter by the (N−1) peaking amplification units, each of which includes M peaking power amplifiers; and combining a power amplified by the carrier amplification unit and the respective split powers amplified by the (N−1) peaking amplification units, and outputting combined power, wherein N represents an integer obtained by adding a number of the carrier amplification units and a number of the (N−1) peaking amplification units, and M represents an integer greater than 1.

10. The method of claim 9, wherein the amplifying of the power output from the power splitter by the carrier amplification unit:

splitting the power output from the power splitter into M powers, and outputting the M powers to the M carrier power amplifiers respectively; and controlling an output direction of a power output from each of the M carrier power amplifiers, so that powers output from the respective M carrier power amplifiers are output to an output end of the carrier amplification unit and are combined at the output end.

11. The method of claim 9, wherein the amplifying splitter of the respective split powers output from the power by the (N−1) peaking amplification units comprises:

splitting a power output from the power splitter into M powers, and outputting the split powers to the M peaking power amplifiers by each of the (N−1) peaking amplification units; and controlling an output direction of a power output from each of the M peaking power amplifiers, so that powers output from each of the M peaking power amplifiers is output to an output end of one of the (N−1) peaking amplification units; and combining the power signals output from the respective M peaking power amplifiers to generate a single power, and outputting the generated single power.

12. The method of claim 9, wherein the combining of the power amplified by the carrier amplification unit and the respective split powers amplified by the (N−1) peaking amplification units comprises:

adjusting a load impedance value at an output end of the carrier amplification unit by a first impedance transformer; and adjusting a load impedance value at a combined point, where the power amplified by the carrier amplification unit and the respective split powers amplified by the (N−1) peaking amplification units are combined, by a second impedance transformer.

13. The method of claim 12, wherein a characteristic impedance value of the first impedance transformer is set to a value that is 1/M times a final output load impedance value.

14. The method of claim 12, wherein a characteristic impedance value of the second impedance transformer is set to a value that is $1/\sqrt{(N \cdot M)}$ times a final output load impedance value.

15. The method of claim 9, wherein the M carrier power amplifiers and the (N−1) peaking power amplifiers are combined in a cell-by-cell basis respectively.

16. The method of claim 9, wherein configuration units in the carrier amplification unit operate regardless of a magnitude of the input power, and configuration units in the (N−1) peaking amplification units operate when the magnitude of the input power is equal to or more than a magnitude of a reference power.

* * * * *

UNITED STATES PATENT AND TRADEMARK OFFICE
CERTIFICATE OF CORRECTION

PATENT NO.        : 8,339,196 B2
APPLICATION NO.   : 12/967404
DATED             : December 25, 2012
INVENTOR(S)       : Sung-Chul Hong and Jin-Wook Lee It is certified that error appears in the above-identified patent and that said Letters Patent is hereby corrected as shown below:

In the Claims

Column 11, Line 3-4, Claim 1, delete the phrase "a number of the carrier amplification units" and insert the phrase --a number of the carrier amplification unit--.

Signed and Sealed this
Ninth Day of June, 2015

Michelle K. Lee
*Director of the United States Patent and Trademark Office*